United States Patent
Porter et al.

(10) Patent No.: US 6,292,407 B1
(45) Date of Patent: Sep. 18, 2001

(54) METHOD AND APPARATUS FOR CIRCUIT VARIABLE UPDATES

(75) Inventors: John D. Porter, Meridian; Larren Gene Weber, Caldwell, both of ID (US)

(73) Assignee: Micron Technolgy, Inc., Boise, ID (US)

( * ) Notice: Subject to any disclaimer, the term of this patent is extended or adjusted under 35 U.S.C. 154(b) by 0 days.

(21) Appl. No.: 09/416,301

(22) Filed: Oct. 12, 1999

(51) Int. Cl.[7] .................................................. G11C 7/00
(52) U.S. Cl. ................ 365/189.11; 365/189.05; 326/30
(58) Field of Search ................ 365/189.11, 189.05; 326/30

(56) References Cited

U.S. PATENT DOCUMENTS

| 4,806,794 | * | 2/1989 | Walters, Jr. ........................... 307/451 |
| 5,095,231 |   | 3/1992 | Sartori et al. ........................ 307/475 |
| 5,448,182 |   | 9/1995 | Countryman et al. ................. 326/30 |
| 5,606,275 |   | 2/1997 | Farhang et al. ..................... 327/108 |
| 5,621,335 | * | 4/1997 | Anderseen ............................ 326/30 |
| 5,666,078 |   | 9/1997 | Lamphier et al. .................... 327/108 |
| 5,751,161 |   | 5/1998 | Wei et al. ............................. 326/30 |
| 5,789,937 | * | 8/1998 | Cao et al. ............................. 326/30 |
| 6,085,033 | * | 6/2000 | Starr et al. ....................... 395/500.15 |
| 6,087,847 | * | 7/2000 | Mooney et al. ....................... 326/30 |

* cited by examiner

*Primary Examiner*—Son T. Dinh
(74) *Attorney, Agent, or Firm*—Schwegman, Lundberg, Woessner & Kluth, P.A.

(57) ABSTRACT

Improved methods and structures are provided that allow for the updating of output driver impedances for a circuit to match an impedance of the transmission line to which the circuit is coupled. In particular, improved methods and structures are provided which allow for a reliable updating of the output driver impedance without requiring the output driver to be tristated in order to prevent data loss. Embodiments of a method of forming an integrated circuit include coupling a data line to an enable input of a holding device. The method also includes coupling at least one impedance line to a data input of the holding device. The at least one impedance line carries an impedance update signal. Further, an impedance of the data line at a data output of the memory device is capable of being updated to a value equal to the impedance update signal when the data line is quiescent. The present invention also includes structures as well as systems incorporating such structures all formed according to the methods provided in this application.

53 Claims, 11 Drawing Sheets

METHOD AND APPARATUS FOR CIRCUIT VARIABLE UPDATES

FIELD OF THE INVENTION

The present invention relates to electronic circuitry. In particular, the present invention relates to methods and structures for providing updates for circuit variables.

BACKGROUND OF THE INVENTION

Impedance matching is one of the design challenges facing the electronics industry due to multiple reflections on transmission lines, e.g., traces on a printed circuit board (PCB). Not limiting these multiple reflections can cause problems that can have an impact at the digital level, including increased delays, increased overshoot and increased ringing (i.e., oscillations) in the signal response. In particular for point to point signaling, it is important to match the driver impedance of the circuit to the impedance of the transmission line to which the circuit is coupled such that the incident wave is roughly half of the driven voltage. Accordingly, as is well known in the art, when the reflection occurs, the reflective wave is approximately the driven voltage and thereby eliminating undershoot and/or overshoot between the circuits connected by the transmission line.

One approach for matching the impedance between a circuit and the transmission line to which the circuit is coupled is to have an onboard controller on the circuit control the impedance. In such a system, the onboard controller periodically updates the impedance of the data output of the circuit to which the transmission line is connected. However, because the data output may be driving data at the point in time when the onboard controller completes the computation of the impedance and is attempting to update the impedance, changing of the impedance value at the data output of the circuit may be hazardous. In particular, if the impedance value at the data output is changing while the data output is transmitting data, intermediate values of the impedance are completely random and could result in values that are not close to the intended impedance for the data output.

One approach to avoid this type of hazard is to limit the updates of the impedance value at the data output such that the updates only occur during a tristated cycle. However, one shortcoming of this approach is that with a separate input/output circuit a tristate cycle may never occur as continuous reads could occur at the data output of the circuit to which the transmission line is connected. For these and other reasons there is a need for the present invention.

SUMMARY OF THE INVENTION

The above-mentioned problems with output driver impedance updates and other problems are addressed by the present invention and will be understood by reading and studying the following specification. Structures and methods are described which accord improved benefits for output driver impedance updates.

In particular, improved methods and structures are provided that allow for the updating of output driver impedances for a circuit to match the impedance of the transmission line to which the circuit is coupled. Additionally, improved methods and structures are provided which allow for a reliable updating of the output driver impedance without requiring the output driver to be tristated in order to prevent data loss.

Embodiments of a method of forming an integrated circuit include coupling a data line to an enable input of a holding device. The method also includes coupling at least one impedance line to a data input of the holding device. The at least one impedance line carries an impedance signal. Further, an impedance of the data line at a data output of the memory device is capable of being updated to a value equal to the impedance update signal when the data line is quiescent. The term quiescent is defined as inactivity (e.g., when the data line is tristated or is in a high impedance mode). The present invention also includes structures as well as systems incorporating such structures all formed according to the methods provided in this application.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
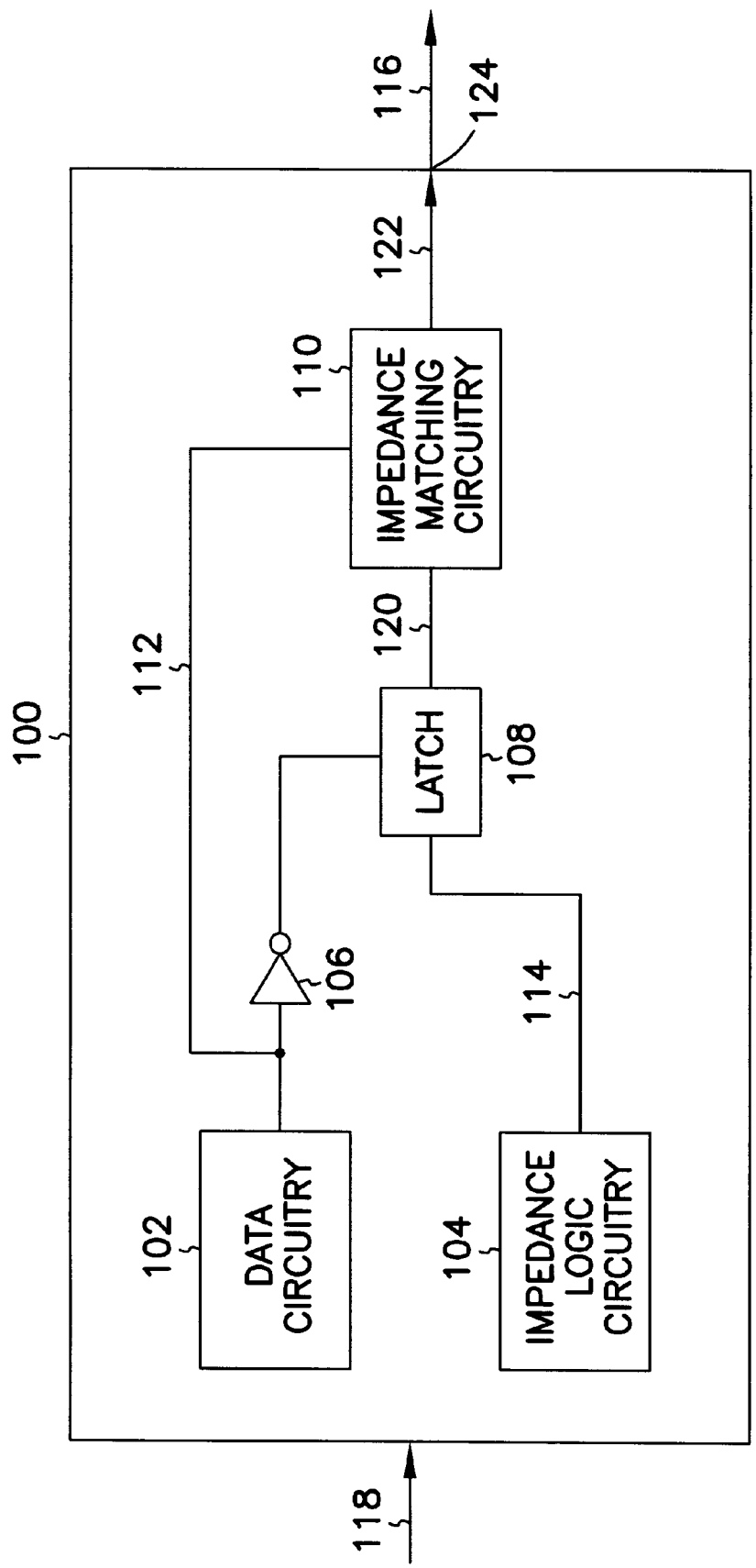
FIG. 1 is one embodiment of an integrated circuit according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The term conductor is understood to include semiconductors, and the term insulator is defined to include any material that is less electrically conductive than the materials referred to as conductors. The term holding device is understood to include a latch or a register. Additionally, the following description includes the terms logic zero and logic one. Typical logic systems switch or alternate an output voltage between just two significant voltage levels, labeled logic zero and logic one. Most logic systems use positive logic, in which logic zero is represented by zero volts (V), or a low voltage, e.g., below 0.5 V; and logic one is represented by a higher voltage.

The term signal line is understood to include a data line an address line a clock line or any other type of signal transmission line. Additionally, the term bus is understood to include one to any number of transmission lines. The following detailed description is, therefore, not to be taken in a limiting sense, and the scope of the present invention is defined only by the appended claims, along with the full scope of equivalents to which such claims are entitled.

FIG. 1 is one embodiment of an integrated circuit according to the teachings of the present invention. In particular, FIG. 1 illustrates integrated circuit 100 which is coupled to clock bus 118 and transmission line 116. Additionally, integrated circuit 100 includes data circuitry 102, impedance logic circuitry 104, inverter 106, latch 108, impedance matching circuitry 110, data bus 112, impedance logic bus 114, latched impedance bus 120 and output data bus 122. Data circuitry 102 is coupled to the input of inverter 106 through data bus 112 and is also coupled to impedance matching circuitry 110 through data bus 112. Impedance logic circuitry 104 is coupled to a data input of latch 108 through impedance logic bus 114, while the output of inverter 106 is coupled to an enable input of latch 108. A data output of latch 108 is coupled to impedance matching circuitry 110 through latched impedance bus 120. Additionally, impedance matching circuitry 110 is coupled to transmission line 116 through output data bus 122 at data output 124.

FIG. 1 illustrates one inverter 106, one latch 108, one impedance matching circuitry 110 along with one line for the buses connecting such devices. However, this use of singular devices and lines is by way of example and not by limitation. In particular, integrated circuit 100 can include multiple transmission lines within data bus 112, impedance logic bus 114, latched impedance bus 120 and output data bus 122. Accordingly, for each transmission line within buses 112, 114, 120 and 122, integrated circuit 100 includes a corresponding inverter 106, latch 108 and impedance matching circuitry 110.

Data circuitry 102 is any type of circuit within integrated circuit 100 which generates data. For example, in one embodiment, data circuitry 102 is a memory array within a memory device. In one embodiment, latch 108 is a circuit in which the outputs follow the inputs when the circuit is enabled and holds the last value when the circuit is disabled, as is well-known in the art.

In one embodiment, impedance logic circuitry 104 is an onboard controller within integrated circuit 100, which is well-known in the art. The onboard controller determines the impedance value for output data bus 122 that matches the impedance of transmission line 116 and transmits this value as a set of binary values (i.e., a binary code) through impedance logic bus 114 and latched impedance bus 120 to impedance matching circuitry 110. For example, assuming that the impedance value is a seven digit binary code, impedance logic bus 114 would include seven lines with each one transmitting a binary value. In one embodiment, impedance logic circuitry 104 generates a new impedance value based on the resistance value of a resistor which is externally coupled to an impedance pin of integrated circuit 100, as is well-known in the art. In one such embodiment, integrated circuit 100 is designed such that the intended impedance value is approximately equal to ⅕ of the resistance value of the resistor externally coupled to integrated circuit 100. In other words, the resistor has a resistance equal to approximately five times the intended impedance value (i.e., the impedance value of the transmission line which integrated circuit 100 is coupled).

Figure 2:
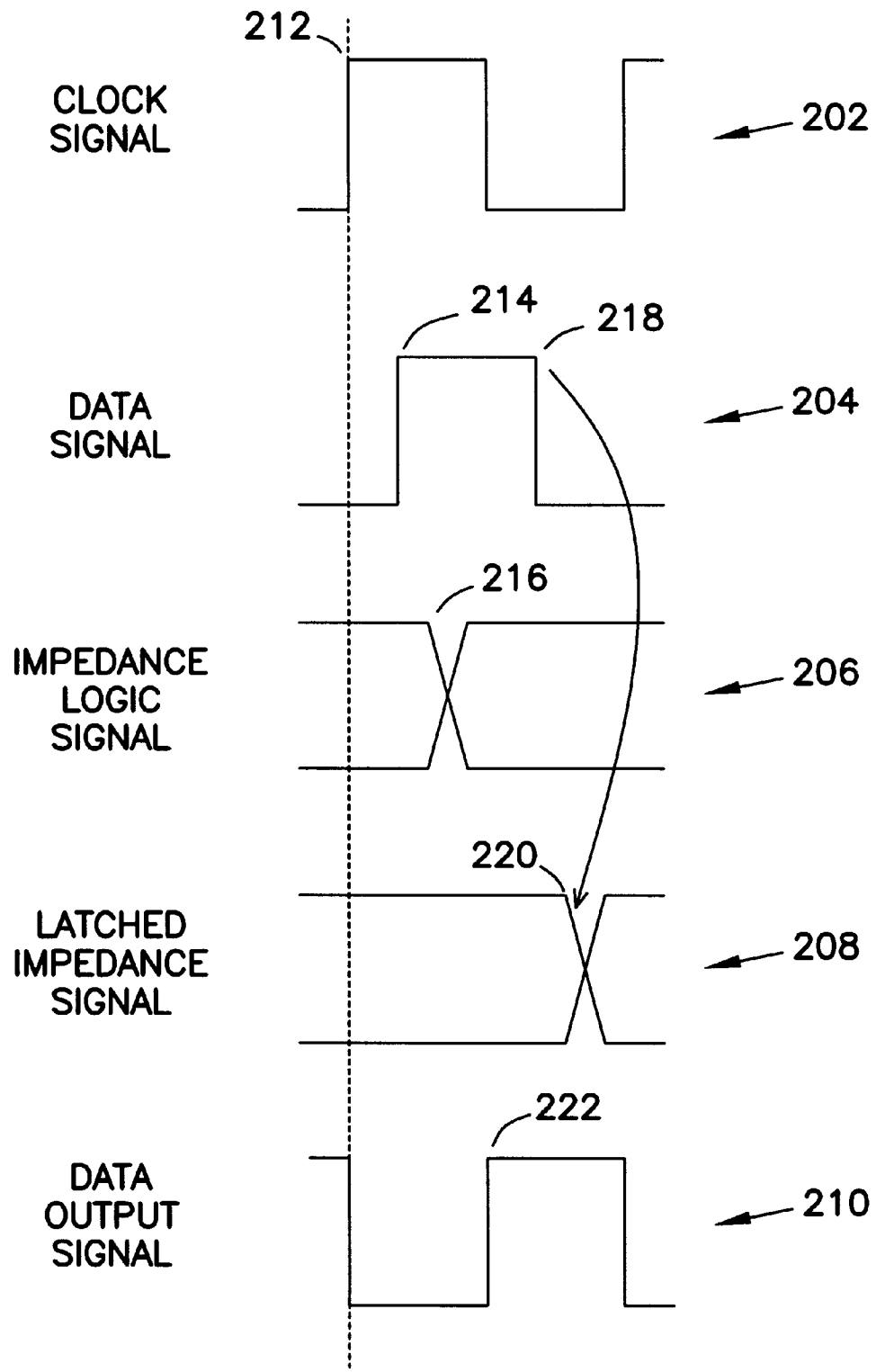
FIG. 2 is a timing diagram illustrating timing of embodiments of the present invention.

The operation of integrated circuit 100 is described in conjunction with the timing diagrams illustrated in FIG. 2. In particular, FIG. 2 includes a timing diagram for clock signal 202 transmitted on clock bus 118, data signal 204 transmitted on data bus 112, impedance logic signal 206 transmitted on impedance logic bus 114, latched impedance signal 208 transmitted on latched impedance bus 120 and data output signal 210 transmitted on output data bus 122. When clock signal 202 produces a rising edge at clock signal point 212, data circuitry 102 generates data that is transmitted as data signal 204 through data bus 112 to inverter 106, which is shown as data signal 204 transitioning from a logic zero to a logic one at data signal point 214. Additionally, data signal 204 is transmitted to impedance matching circuitry 110, which causes data output signal 210 to be transmitted out to transmission line 116 through output data bus 122, which is shown as data output signal point 222.

Additionally, this rising edge of clock signal 202 at clock signal point 212 causes impedance logic circuitry 104 to generate a new impedance value that is transmitted as impedance logic signal 206 (e.g., a binary code) through impedance logic bus 114 at impedance logic signal point 216. In one embodiment, impedance logic circuitry 104 generates a new impedance value to be transmitted on impedance logic bus 114 approximately every 512 clock cycles.

In one embodiment, integrated circuit 100 is designed such that impedance logic signal point 216 occurs subsequently to data signal point 214. Advantageously, this design enables data signal 204 to be inverted through inverter 106 and to disable latch 108 prior to the arrival of impedance logic signal 206 at the data input of latch 108.

Accordingly, disablement of latch 108 causes latch 108 to delay the transmitting of the new impedance value as impedance logic signal 206 (e.g., a binary code). In turn, this precludes impedance matching circuitry 110 from updating the impedance of output data pins with this new impedance value while data bus 112 is passing data as data signal 204. In other words, latched impedance signal 208 is precluded from transitioning by latch 108 while data signal 204 is a logic one (i.e., active). Therefore, impedance matching circuitry 110 only updates the impedance at the output data pins when data bus 112 is inactive. Moreover, when data bus 112 is active, impedance matching circuitry 110 applies the impedance value to the output data pins that was set prior to data bus 112 moving from an inactive to an active state. In other words, impedance matching circuitry 110 uses the prior (i.e., old) impedance value when data bus 112 is in an active state.

Once data signal 204 goes to a logic zero at data signal point 218, data bus 112 passes a logic zero to inverter 106 which in turn enables latch 108. Accordingly, latch 108 then latches impedance logic signal 206 to its data output as latched impedance signal 208 on latched impedance bus 120, which causes the transition of latched impedance signal 208 at latched impedance signal point 220. In turn, based on this new impedance value, impedance matching circuitry 110 updates the impedance at data output 124 to match the impedance of transmission line 116. Advantageously, the impedance at data output 124 is updated when output data bus 122 is quiescent (i.e., inactive); not while the output data bus 122 is transmitting data.

Figure 3:
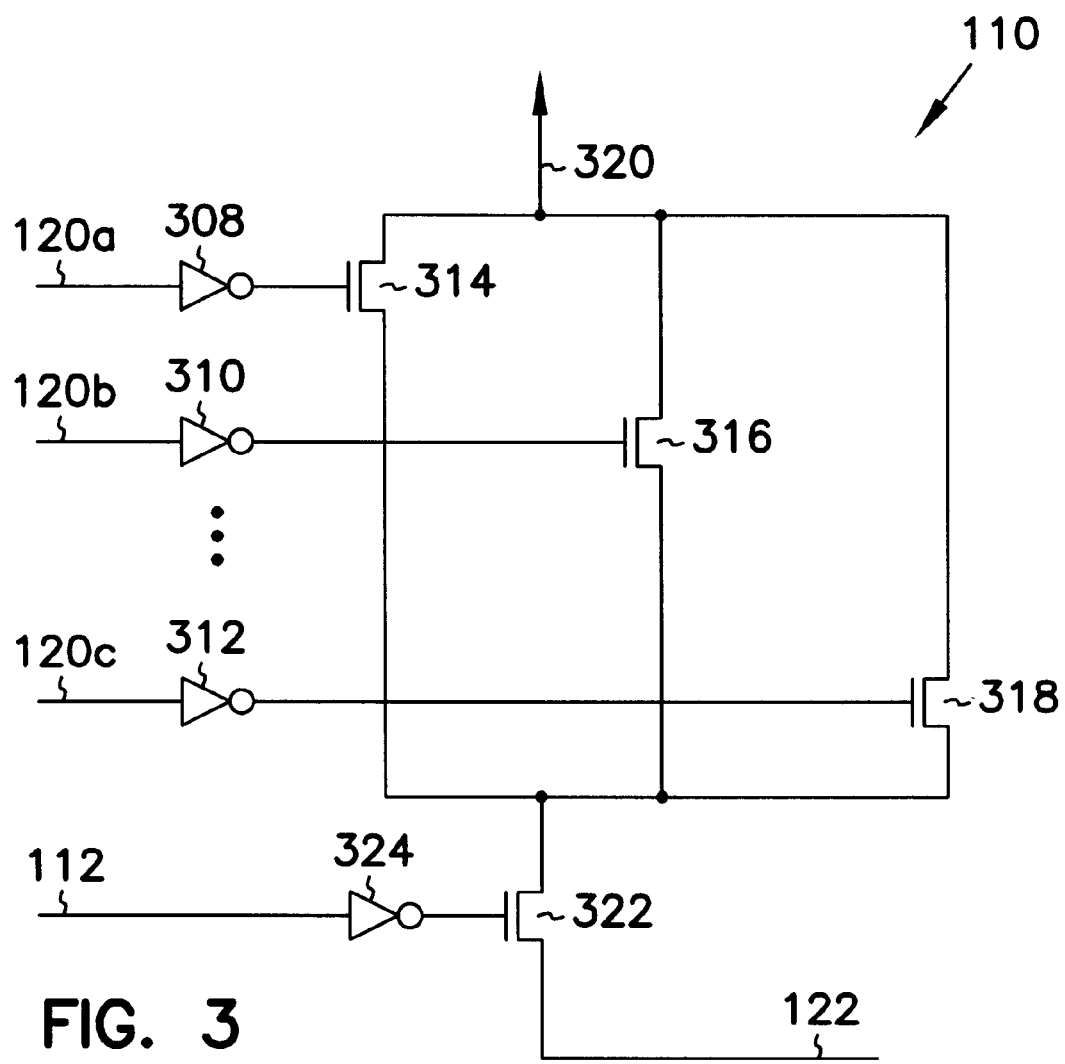
FIG. 3 is one embodiment of impedance matching circuitry according to the teachings of the present invention.

FIG. 3 is one embodiment of impedance matching circuitry 110 according to the teachings of the present invention. In particular, FIG. 3 illustrates impedance matching circuitry 110 which is coupled to latched impedance bus 120 (which includes latched impedance lines $120a \geq c$), data bus 112, output data bus 122, and upper voltage source 320. Latched impedance lines 120a–c are each respectively coupled to the input of inverters 308–312. The output of inverters 308–312 are respectively coupled to the gates of transistors 314–318. The sources of transistors 314–318 are coupled to upper voltage source 320 while the drains of transistors 314–318 are coupled to the source of transistor 322. Additionally, impedance matching circuitry 110 includes inverter 324 whose input is coupled to data bus 112. The output of inverter 324 is coupled to the gate of transistor 322. The drain of transistor 322 is coupled to output data bus 122. In one embodiment, transistors 314–318 and 322 are p-type metal oxide semiconductor field effect transistors (p-MOSFETs).

Impedance matching circuitry 110 is designed such that transistors 314–318 have varying impedances. Accordingly, the level of impedance at output data bus 122 is dependent on which and how many of transistors 314–318 are turned on. In particular, impedance matching circuitry 110 receives a binary code from latched impedance bus 120. Latched impedances lines 120a–c each transmit a logic one or a logic zero, which causes transistors 314–318 to turn on or off, respectively. Accordingly, when data bus 112 transitions high, output data bus 122 receives a current flow from voltage source 320 which is dependent on the impedance level which is set by which and how many of transistors 314–318 are turned on. In other words, the impedance level at output data bus 122 is set by the binary code transmitted on latched impedance lines 120-a–c. Therefore, impedance logic circuitry 104 determines the impedance level at output data bus 122 that matches the impedance of transmission line 116 and transmits this impedance level as a binary code to impedance matching circuitry 110 along latched impedance bus 120. Accordingly, impedance matching circuitry 110 matches the impedance level at the output data bus 122 to the impedance level of transmission line 116.

Figure 4:
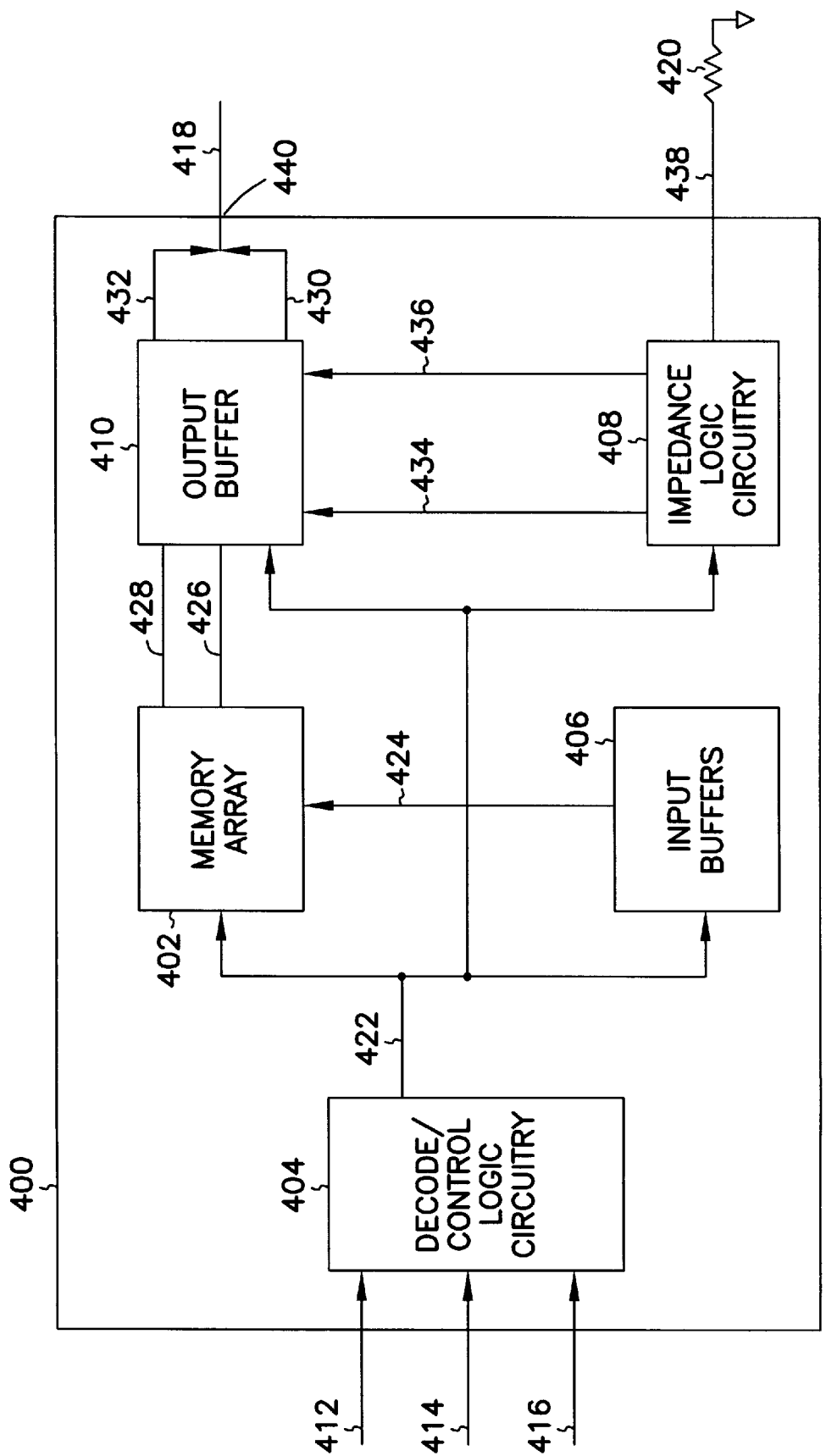
FIG. 4 is another embodiment of an integrated circuit according to the teachings of the present invention.

FIG. 4 is another embodiment of an integrated circuit according to the teachings of the present invention. In particular, FIG. 4 illustrates memory device 400 which is coupled to address bus 412, clock bus 414, read/write bus 416, transmission line 418 and resistor 420. Memory device 400 includes memory array 402, decode/control circuitry 404, input buffers 406, impedance logic circuitry 408 and output buffers 410. Further, memory device 400 includes decode/control bus 422, input bus 424, pulldown data bus 426, pullup data bus 428, output pulldown data bus 430, output pullup data bus 432, pulldown impedance logic bus 434, pullup impedance logic bus 436, output impedance pin 438 and data output 440.

Address bus 412, clock bus 414 and read/write bus 416 are coupled to decode/control circuitry 404. Internal to memory device 400, decode/logic circuitry 404 is coupled to memory array 402, input buffers 406, impedance logic circuitry 408 and output buffers 410 through decode/control bus 422. Input buffers 406 are coupled to memory array 402 through input bus 424. Additionally, memory array 402 is coupled to output buffers 410 through pulldown data bus 426 and pullup data bus 428, and impedance logic circuitry 408 is coupled to output buffers 410 through pulldown impedance logic bus 434 and pullup impedance logic bus 436. Further, impedance logic circuitry 408 is coupled to resistor 420 through output impedance pin 438, and output buffers 410 are coupled to transmission line 418 through output pulldown data bus 430 and output pullup data bus 432 at data output 440.

Figure 5:
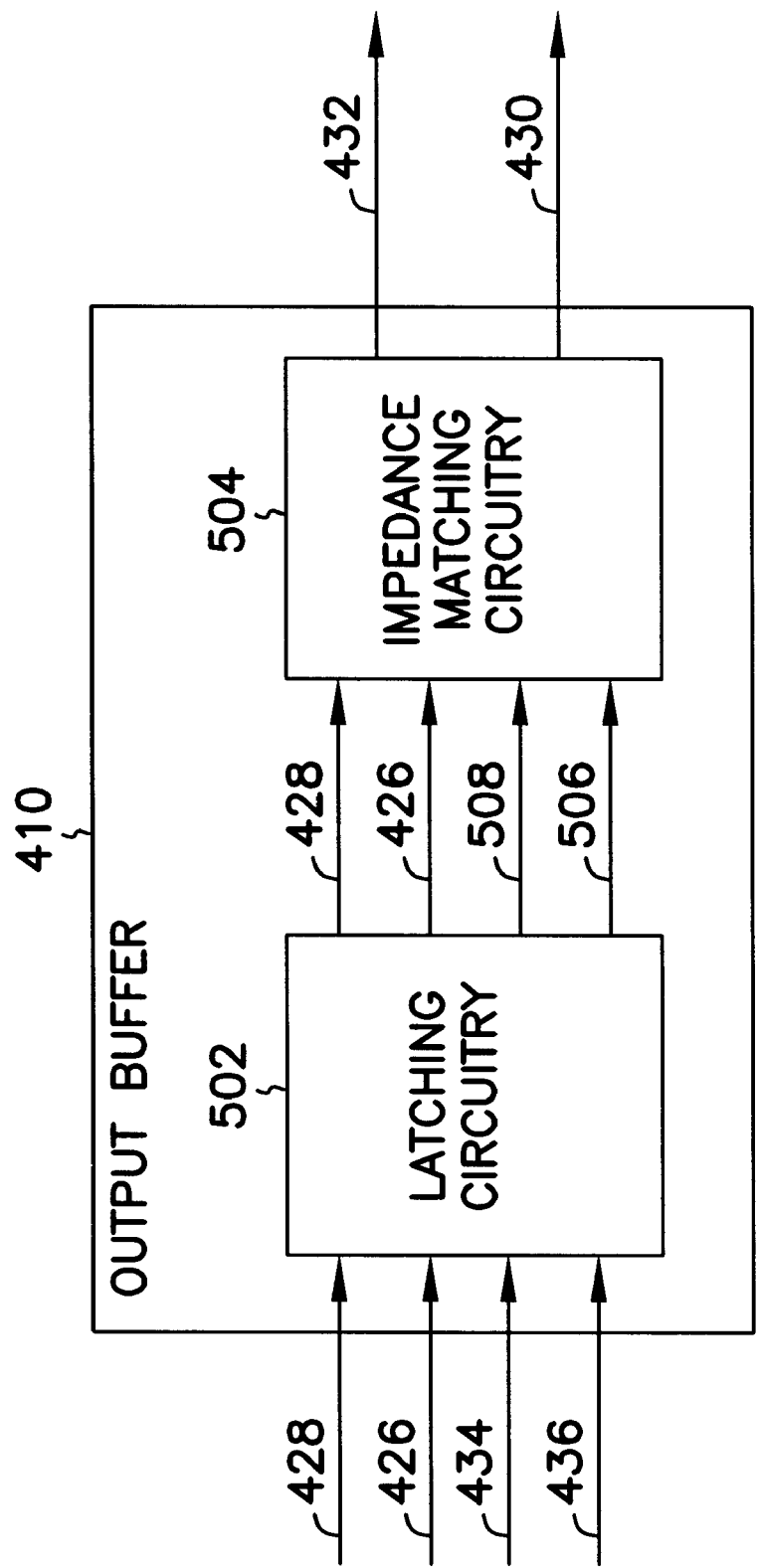
FIG. 5 is one embodiment of an output buffer of an integrated circuit according to the teachings of the present invention.

Additionally, one embodiment of output buffers 410 is illustrated in FIG. 5. In particular, FIG. 5 includes latching circuitry 502 and impedance matching circuitry 504. Latching circuitry 502 is coupled to memory array 402 through pulldown data bus 426 and pullup data bus 428. Further, latching circuitry 502 is coupled to impedance logic circuitry 408 through pulldown impedance logic bus 434 and pullup impedance logic bus 436. Impedance matching circuitry 504 is coupled to latching circuitry 502 through pulldown data bus 426, pullup data bus 428 as well as pulldown latched impedance bus 506 and pullup latched impedance bus 508. Moreover, impedance matching circuitry 504 is coupled to transmission line 418 through output pulldown data bus 430 and output pullup data bus 432 at data output 440.

Figure 6:
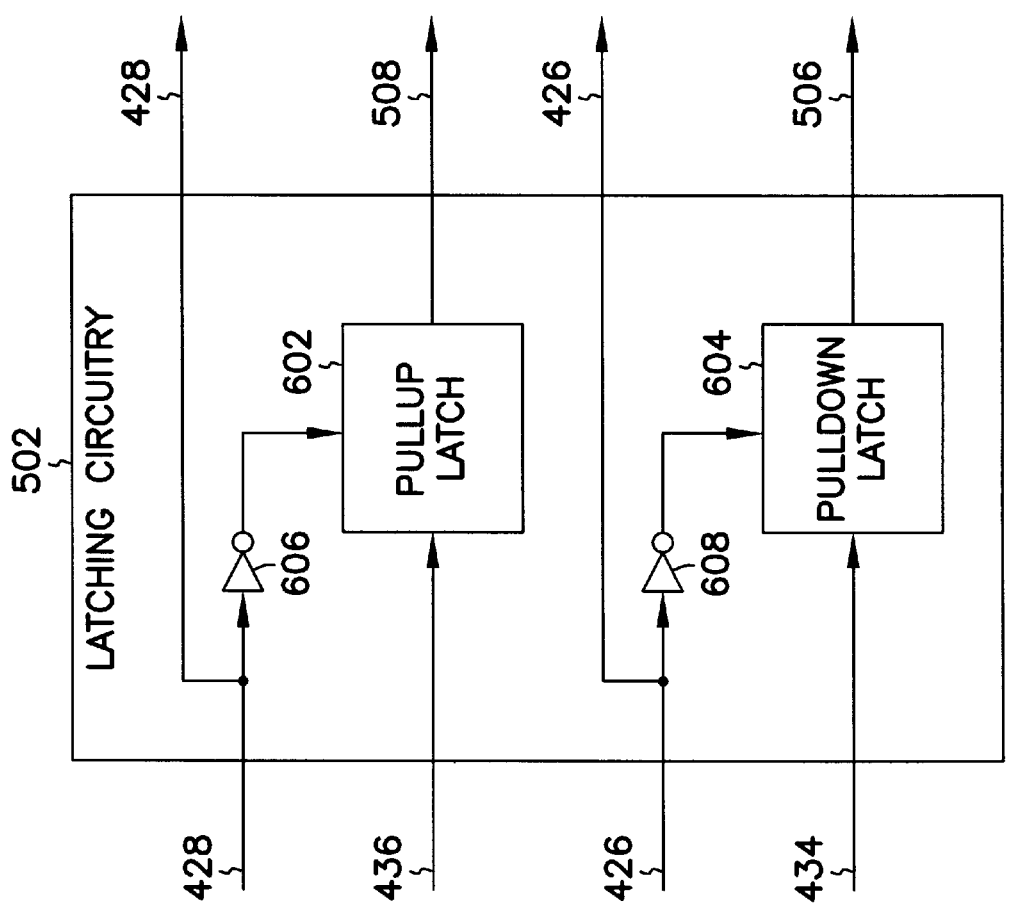
FIG. 6 is one embodiment of latching circuitry according to the teachings of the present invention.

FIG. 6 illustrates one embodiment of latching circuitry 502 of FIG. 5. In particular, FIG. 6 includes pullup latch 602, pulldown latch 604 and inverters 606–608. The input of inverter 606 is coupled to memory array 402 through pullup data bus 428, while the output of inverter 606 is coupled to the enable input of pullup latch 602. Additionally, the data input of pullup latch 602 is coupled to impedance logic circuitry 408 through pullup impedance logic bus 436. The input of inverter 608 is coupled to memory array 402 through pulldown data bus 426, while the output of inverter 608 is coupled to the enable input of pulldown latch 604. The data input of pulldown latch 604 is coupled to impedance logic circuitry 408 through pulldown impedance logic bus 434. Furthermore, the output of latching circuitry 502 illustrated in FIG. 6 includes pullup data bus 428, pulldown data bus 426 as well as pullup latched impedance bus 508 and pulldown latched impedance bus 506, which are the coupled to the data output of pullup latch 602 and pulldown latch 604, respectively.

Figure 7A:
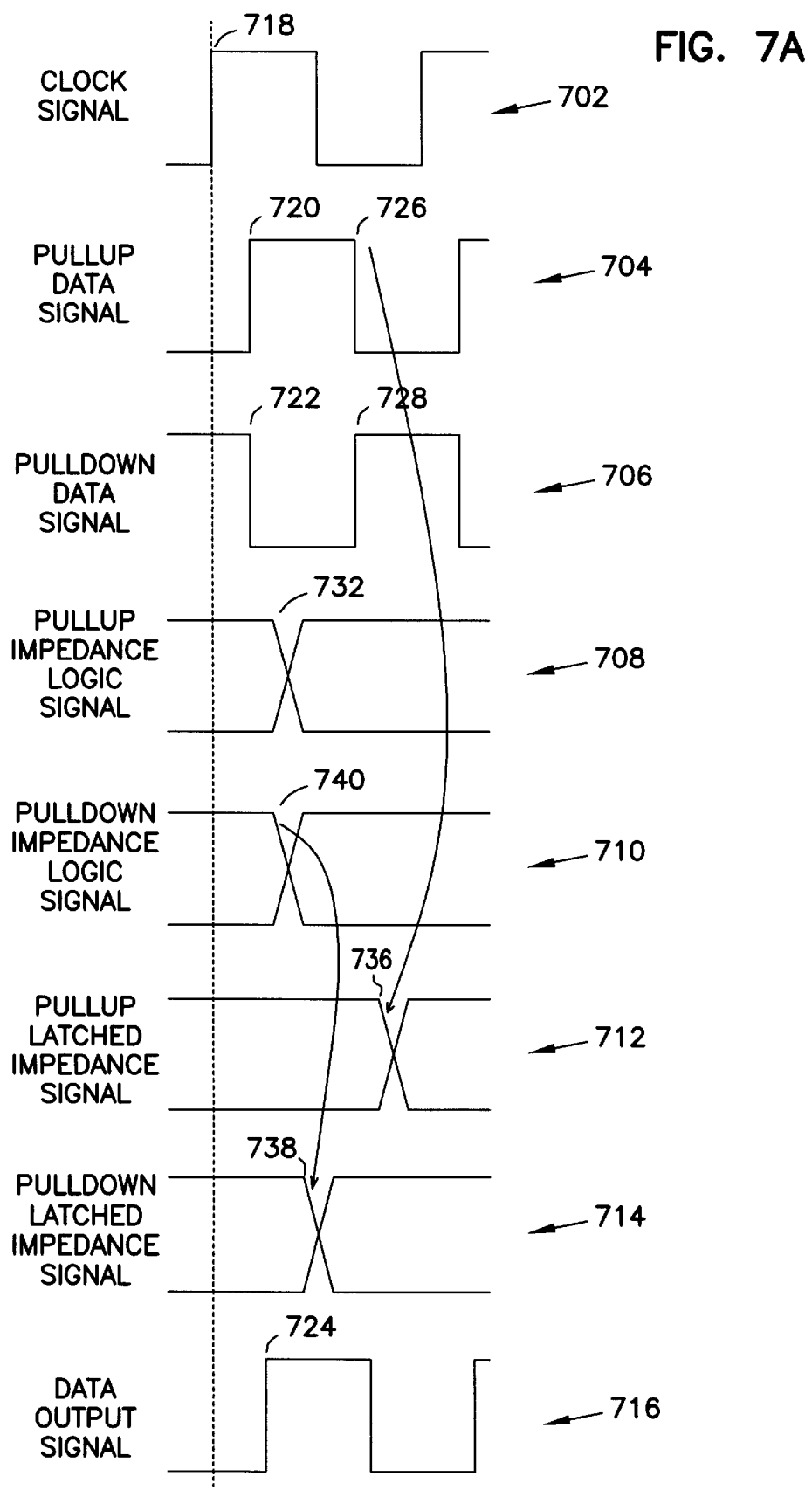
FIGS. 7a–7b are timing diagrams illustrating timing of embodiments of the present invention.
Figure 7B:
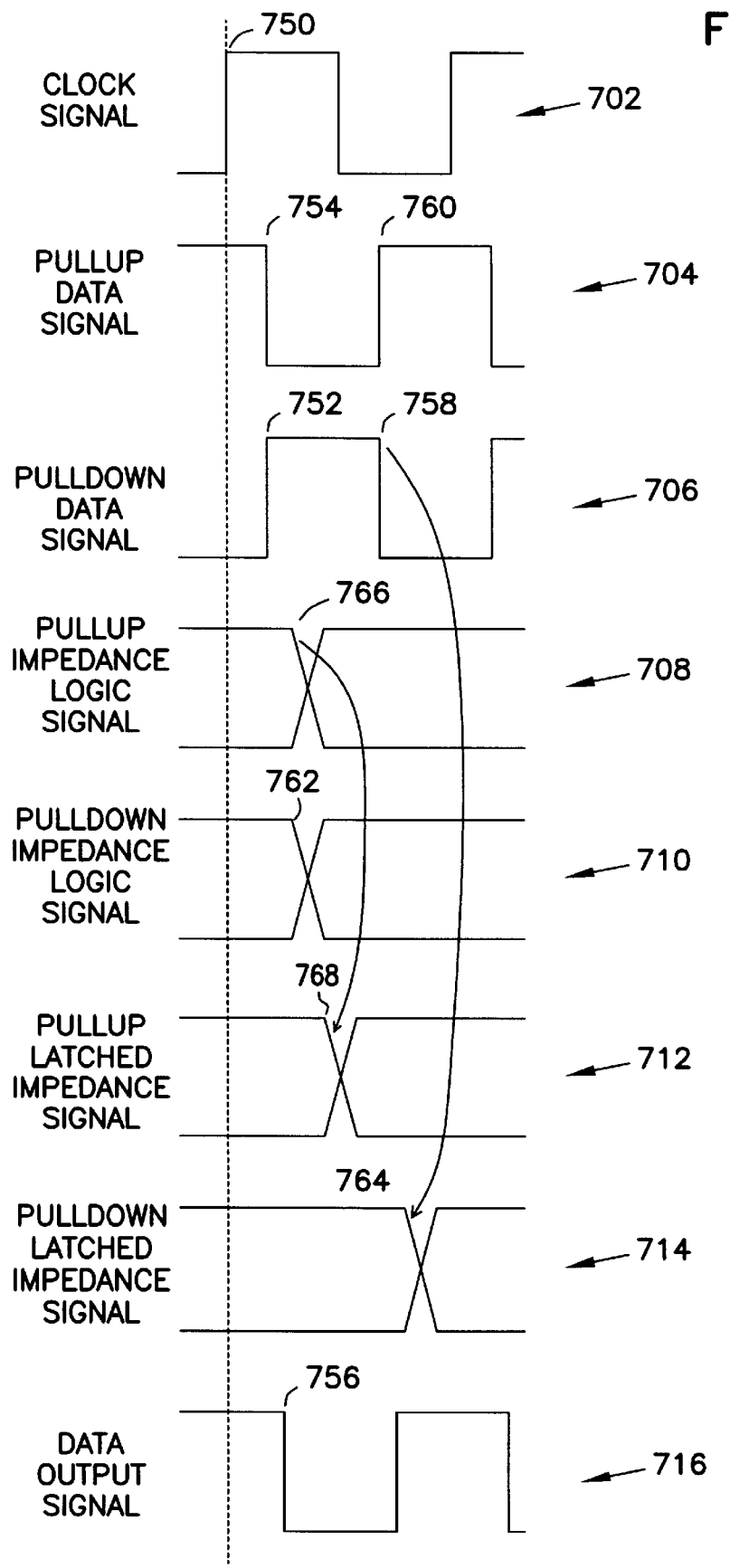

A typical read operation from memory device 400 including its embodiments illustrated in FIGS. 5–6 is described in conjunction with the timing diagrams illustrated in FIGS. 7a–7b. FIG. 7a illustrates the timing sequences when a signal on pullup data bus 428 transitions to a logic one caused by a signal on clock bus 414 transitioning to a logic one. Further FIG. 7b illustrates the timing sequences when a signal on pulldown data bus 426 transitions to a logic one causing a signal on clock bus 414 transitioning to a logic one.

In particular, FIG. 7a includes timing diagrams for (1) clock signal 702 transmitted on clock bus 414, (2) pullup data signal 704 transmitted on pullup data bus 428, (3) pulldown data signal 706 transmitted on pulldown data bus 426, (4) pullup impedance logic signal 708 transmitted on pullup impedance logic bus 436, (5) pulldown impedance logic signal 710 transmitted on pulldown impedance logic bus 434, (6) pullup latched impedance signal 712 transmitted on pullup latched impedance bus 508, (7) pulldown latched impedance signal 714 transmitted on pulldown latched impedance bus 506 and (8) data output signal 716 transmitted on output pulldown data bus 430 and output pullup data bus 432 at data output 440.

When clock signal 702 produces a rising edge at clock signal point 718, memory array 402 transmits data to output buffers 410 through pullup data bus 428 and pulldown data bus 426, which corresponds to the data located at the address on address bus 412. In this example, this causes pullup data signal 704 to transition from logic zero to logic one at pullup data signal point 720 and pulldown data signal 706 to transition from logic one to logic zero at pulldown data signal point 722. In turn, output buffers 410 transmits this data through latch circuitry 502 and impedance matching circuitry 504 out to transmission line 418 at data output 440 through output pulldown data bus 430 and output pullup data bus 432, which is shown at data output signal point 724 of data output signal 716.

Additionally, this rising edge of clock signal 702 at clock signal point 718 causes impedance logic circuitry 408 to generate a new impedance value for both the pullup and pulldown portion of data output 440. In one embodiment, impedance logic circuitry 408 generates a new impedance value based on the resistance value of resistor 420, as is well-known in the art. In one such embodiment, impedance logic circuitry 408 is designed such that the intended impedance value is approximately equal to ⅕ of the resistance value of resistor 420 externally coupled to memory device 400. In other words, resistor 420 has a resistance equal to approximately 5 times the intended impedance value (i.e., the impedance value of transmission line 418 which memory device 400 is coupled).

Impedance logic circuitry 408 then transmits this value as pullup impedance logic signal 708 through pullup impedance logic bus 436 and as pulldown impedance logic signal 710 through pulldown impedance logic bus 434. In reference to the timing diagrams illustrated in FIG. 7a, pullup impedance logic signal 708 transitions at pullup impedance logic signal point 732, and pulldown impedance logic signal 710 transitions at pulldown impedance logic signal point 740. In one embodiment, impedance logic circuitry 408 generates a new impedance value to be transmitted on pullup impedance logic bus 436 and pulldown impedance logic bus 434 approximately every 512 clock cycles.

Further, when pulldown data signal 706 is transmitted as a logic zero on pulldown data bus 426 to inverter 608, pulldown latch 604 becomes active (i.e., pulldown latch 604 is open). Accordingly, pulldown latch 604 passes pulldown impedance logic signal 710 to its data output as pulldown latch impedance signal 714 on pulldown latched impedance bus 506, which causes the transition of pulldown latched impedance signal 714 at pulldown latched impedance signal point 738. In turn, based on this impedance value, impedance matching circuitry 504 updates the impedance at data output 440 for the pulldown portion of the data output signal to match the impedance of transmission line 418. Advantageously, the impedance at data output 440 for the pulldown portion of the data output signal is updated when output pulldown data bus 430 is quiescent (i.e., inactive); not while output pulldown data bus 430 is transmitting data.

In one embodiment, memory device 400 is designed such that pullup impedance logic signal point 732 occurs subsequently to pullup data signal point 720. Advantageously, this design enables pullup data signal 704 to be inverted through inverter 606 and to close pullup latch 602 prior to the arrival of pullup impedance logic signal 708 at the data input of latch 602.

Accordingly, the closing of pullup latch 602 causes pullup latch 602 to delay the new impedance value being transmitted as pullup impedance logic signal 708. In turn, this precludes impedance matching circuitry 504 from updating the impedance of output pullup data bus 432 at data output 440. In other words, pullup latched impedance signal 712 is precluded from transitioning by pullup latch 602 while pullup data signal 704 is high or active. Therefore, impedance matching circuitry 504 only updates the impedance for the pullup portion of data output 440 when pullup data bus 432 is inactive. Moreover, when pullup data bus 432 is active, impedance matching circuitry 504 applies the impedance value at the pullup portion of data output 440 that was set prior to pullup data bus 432 moving from an inactive to an active state. In other words, impedance matching circuitry 504 uses the prior (i.e., old) impedance value for the pullup portion of data output 440 when pullup data bus 432 is in an active state.

Once pullup data signal 704 goes to a logic zero at pullup data signal point 726, pullup data bus 428 passes a logic zero to inverter 606 which in turn enables pullup latch 602. Accordingly, pullup latch 602 then passes pullup impedance logic signal 708, to its data output as pullup latched impedance signal 712 on pullup latched impedance bus 508, which causes the transition of pullup latched impedance signal 712 at pullup latched impedance signal point 736. In turn, based on this impedance value, impedance matching circuitry 504 updates the impedance at data output 440 for the pullup portion of the data output signal to match the impedance of transmission line 418. Advantageously, the impedance at data output 440 for the pullup portion of the data output signal is updated when output pullup data bus 432 is quiescent (i.e., inactive); not while output pullup data bus 432 is transmitting data.

Referring to FIG. 7b, the timing diagrams of FIG. 7b illustrate the timing sequences when a signal on pulldown data bus 426 transitions to a logic one when a signal on clock bus 414 transitions to a logic one. In particular, FIG. 7b includes timing diagrams for (1) clock signal 702 transmitted on clock bus 414, (2) pullup data signal 704 transmitted on pullup data bus 428, (3) pulldown data signal 706 transmitted on pulldown data bus 426, (4) pullup impedance logic signal 708 transmitted on pullup impedance logic bus 436 (5) pulldown impedance logic signal 710 transmitted on pulldown impedance logic bus 434, (6) pullup latched impedance signal 712 transmitted on pullup latched impedance bus 508, (7) pulldown latched impedance signal 714 transmitted on pulldown latched impedance bus 506 and (8) data output signal 716 transmitted on output pulldown data bus 430 and output pullup data bus 432 at data output 440.

When clock signal 702 produces a rising edge at clock signal point 750, memory array 402 transmits data to output buffers 410 through pullup data bus 428 and pulldown data bus 426, which corresponds to the data located at the address on address bus 412. In this example, this causes pulldown data signal 706 to transition from logic zero to logic one at pullup data signal point 752 and pullup data signal 704 to transition from logic one to logic zero at pullup data signal point 754. In turn, output buffers 410 transmits this data through latching circuitry 502 and impedance matching circuitry 504 out to transmission line 418 at data output 440 through output pulldown data bus 430 and output pullup data bus 432, which is shown at data output signal point 756 of data output signal 716.

Additionally, this rising edge of clock signal 702 at clock signal point 750 causes impedance logic circuitry 408 to generate a new impedance value for both the pullup and pulldown portion of data output 440. In one embodiment, impedance logic circuitry 408 generates a new impedance value based on the resistance value of resistor 420, as is well-known in the art. In one such embodiment, impedance logic circuitry 408 is designed such that the intended impedance value is approximately equal to ⅕ of the resistance value of resistor 420 externally coupled to memory device 400. In other words, resistor 420 has a resistance equal to approximately 5 times the intended impedance value (i.e., the impedance value of transmission line 418 which memory device 400 is coupled).

Impedance logic circuitry 408 then transmits this value as pullup impedance logic signal 708 through pullup impedance logic bus 436 and as pulldown impedance logic signal 710 through pulldown impedance logic bus 434. In reference to the timing diagrams illustrated in FIG. 7*b*, pullup impedance logic signal 708 transitions at pullup impedance logic signal point 766, and pulldown impedance logic signal 710 transitions at pulldown impedance logic signal point 762. In one embodiment, impedance logic circuitry 408 generates a new impedance value to be transmitted on pullup impedance logic bus 436 and pulldown impedance logic bus 434 approximately every 512 clock cycles.

Further, when pullup data signal 704 is transmitted as a logic zero on pullup data bus 428 to inverter 606, pullup latch 602 becomes active (i.e., pullup latch 602 is open). Accordingly, pullup latch 602 passes pullup impedance logic signal 708 to its data output as pullup latched impedance signal 712 on pullup latched impedance bus 508, which causes the transition of pullup latched impedance signal 712 at pullup latched impedance signal point 768. In turn, based on this impedance value, impedance matching circuitry 504 updates the impedance at data output 440 for the pullup portion of the data output signal to match the impedance of transmission line 418. Advantageously, the impedance at data output 440 for the pullup portion of the data output signal is updated when output pullup data bus 432 is quiescent (i.e., inactive); not while output pullup data bus 432 is transmitting data.

In one embodiment, memory device 400 is designed such that pulldown impedance logic signal point 762 occurs subsequently to pulldown data signal point 752. Advantageously, this design enables pulldown data signal 706 to be inverted through inverter 608 and to close pulldown latch 604 prior to the arrival of pulldown impedance logic signal 710 at the data input of pulldown latch 604.

Accordingly, the closing of pulldown latch 604 causes pulldown latch 604 to delay the new impedance value being transmitted as pulldown impedance logic signal 710. In turn, this precludes impedance matching circuitry 504 from updating the impedance of output pulldown data bus 430 at data output 440. In other words, pulldown latched impedance signal 714 is precluded from transitioning by pulldown latch 604 while pulldown data signal 706 is high or active. Therefore, impedance matching circuitry 504 only updates the impedance for the pulldown portion of data output 440 when pulldown data bus 430 is inactive. Moreover, when output pulldown data bus 430 is active, impedance matching circuitry 504 applies the impedance value at the pulldown portion of data output 440 that was set prior to pulldown data bus 430 moving from an inactive to an active state. In other words, impedance matching circuitry 504 uses the prior (i.e., old) impedance value for the pulldown portion of data output 440 when pulldown data bus 430 is in an active state.

Once pulldown data signal 706 goes to a logic zero at pulldown data signal point 758, pulldown data bus 426 passes a logic zero to inverter 608 which in turn enables pulldown latch 604. Accordingly, pulldown latch 604 then passes pulldown impedance logic signal 710 to its data output as pulldown latched impedance signal 714 on pulldown latched impedance bus 506, which causes the transition of pulldown latched impedance signal 714 at pulldown latched impedance signal point 764. In turn, based on this impedance value, impedance matching circuitry 504 updates the impedance at data output 440 for the pulldown portion of the data output signal to match the impedance of transmission line 418. Advantageously, the impedance at data output 440 for the pulldown portion of the data output signal is updated when output pulldown data bus 430 is quiescent (i.e., inactive); not while output pulldown data bus 430 is transmitting data.

Figure 8:
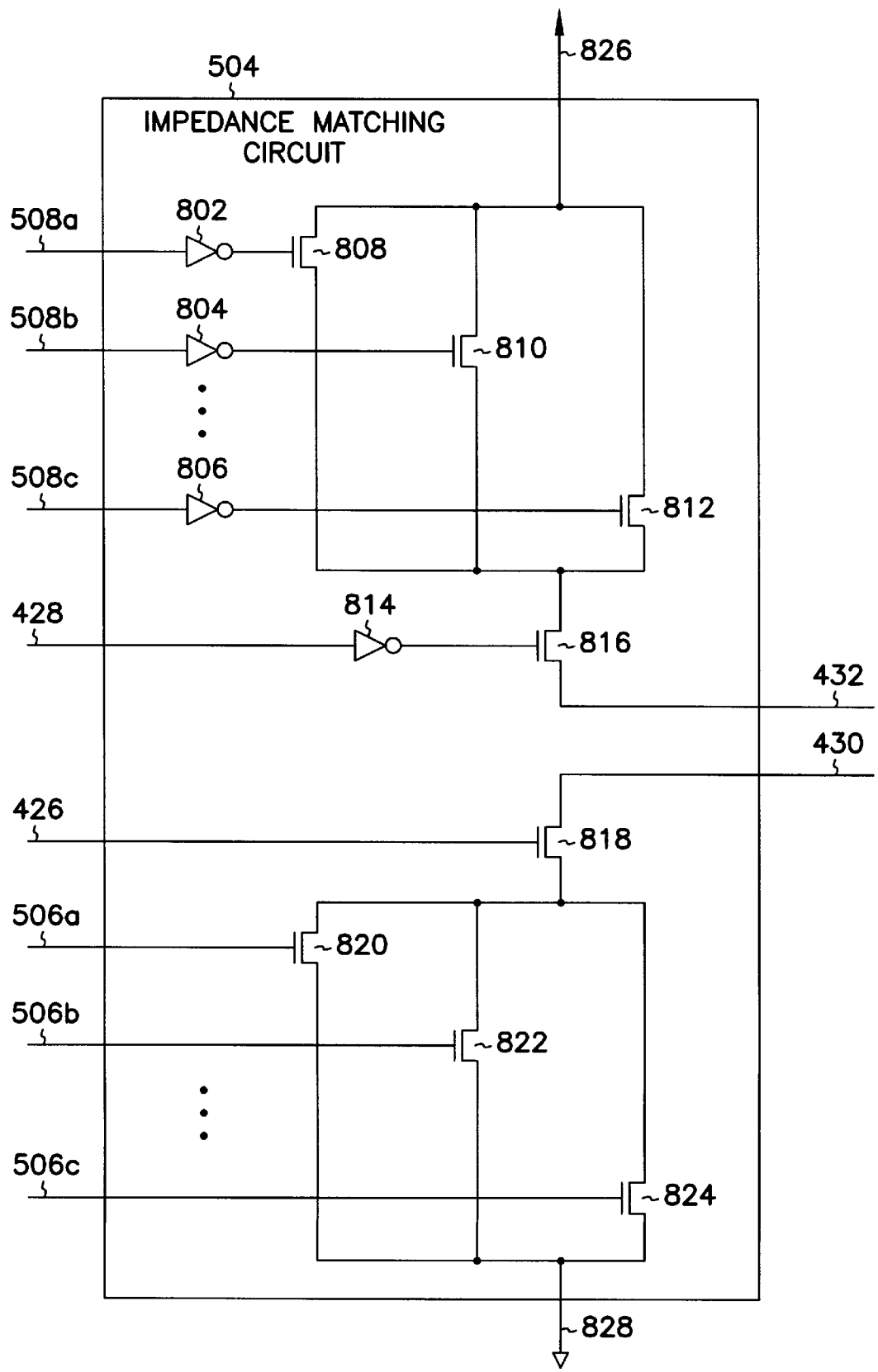
FIG. 8 is another embodiment of impedance matching circuitry according to the teachings of the present invention.

FIG. 8 is one embodiment of impedance matching circuitry 504 according to the teachings of the present invention. In particular, FIG. 8 illustrates impedance matching circuitry 504 which is coupled to (1) pullup latched impedance bus 508, which includes pullup latched impedance lines 508*a–c*, (2) pulldown latched impedance bus 506, which includes pulldown latched impedance lines 506*a–c*, (3) pullup data bus 428, (4) pulldown data bus 426, (5) upper voltage source 826 and (6) lower voltage source 828.

Pullup latched impedance lines 508*a–c* are each respectively coupled to the input of inverters 802–806. The output of inverters 802–806 are respectively coupled to the gates of transistors 808–812. The sources of transistors 808–812 are coupled to upper voltage source 826 while the drains of transistors 808–812 are coupled to the source of transistor 816. Additionally, impedance matching circuitry 504 includes inverter 814 whose input is coupled to pullup data bus 428. The output of inverter 814 is coupled to the gate of transistor 816. The drain of transistor 816 is coupled to output pullup data bus 432. In one embodiment, transistors 808–812 and 816 are p-MOSFETs. The drain of transistor 818 is coupled to output pulldown data bus 430. Further, the gate of transistor 818 is coupled to pulldown data bus 426 and the source of transistor 818 is coupled to the drain of transistors 820–824. Additionally, pulldown latched impedance lines 506*a–c* are each respectively coupled to the gates of transistors 820–824. The source of transistors 820–824 are coupled to lower voltage source 828. In one embodiment, transistors 818 and 820–824 are n-MOSFETs.

Impedance matching circuitry 504 is designed such that transistors 808–812 have various impedances. Accordingly, the level of impedance at data output 440 for the pullup portion of the data output signal is dependent on which and how many transistors 808–812 are turned on. In particular, impedance matching circuitry 504 receives a binary code from pullup impedance logic bus 436. Multiple lines within pullup impedance logic bus 436 each transmit a high or a low value, which causes transistors 808–812 to turn on or off, respectively. Accordingly, when pullup data bus 428 transitions high, output pullup data bus 432 receives a current flow from upper voltage source 826 which is dependent on the impedance level which is set by which and how many of transistors 808–812 are turned on. In other words, the impedance level for the pullup portion of the data output signal is set by the binary code transmitted on pullup latched impedance bus 508.

Therefore, impedance logic circuitry 408 determines the impedance level at output pullup data bus 432 that matches the impedance of transmission line 418, using techniques well-known in the art, and transmits this impedance level as a binary code to impedance matching circuitry 504 along pullup latched impedance bus 508. Accordingly, impedance matching circuitry 504 matches the impedance level for the pullup portion of the data output signal to the impedance level of transmission line 418.

Similar for the pulldown portion, impedance matching circuitry 504 is designed such that transistors 820–824 have various impedances. Accordingly, the level of impedance at data output 440 for the pulldown portion of the data output signal is dependent on which and how many transistors 820–824 are turned on. In particular, impedance matching circuitry 504 receives a binary code from pulldown impedance logic bus 434. Multiple lines within pulldown impedance logic bus 434 each transmit a high or a low value, which causes transistors 820–824 to turn on or off, respectively. Accordingly, when pulldown data bus 426 transitions high, output pulldown data bus 430 receives a current flow from lower voltage source 828 which is dependent on the impedance level which is set by which and how many of transistors 820–824 are turned on. In other words, the impedance level for the pulldown portion of the data output signal is set by the binary code transmitted on pulldown latched impedance bus 506.

Therefore, impedance logic circuitry 408 determines the impedance level at output pulldown data bus 430 that matches the impedance of transmission line 418, using techniques well-known in the art, and transmits this impedance level as a binary code to impedance matching circuitry 504 along pulldown latched impedance bus 506. Accordingly, impedance matching circuitry 504 matches the impedance level for the pulldown portion of the data output signal to the impedance level of transmission line 418.

Figure 9:
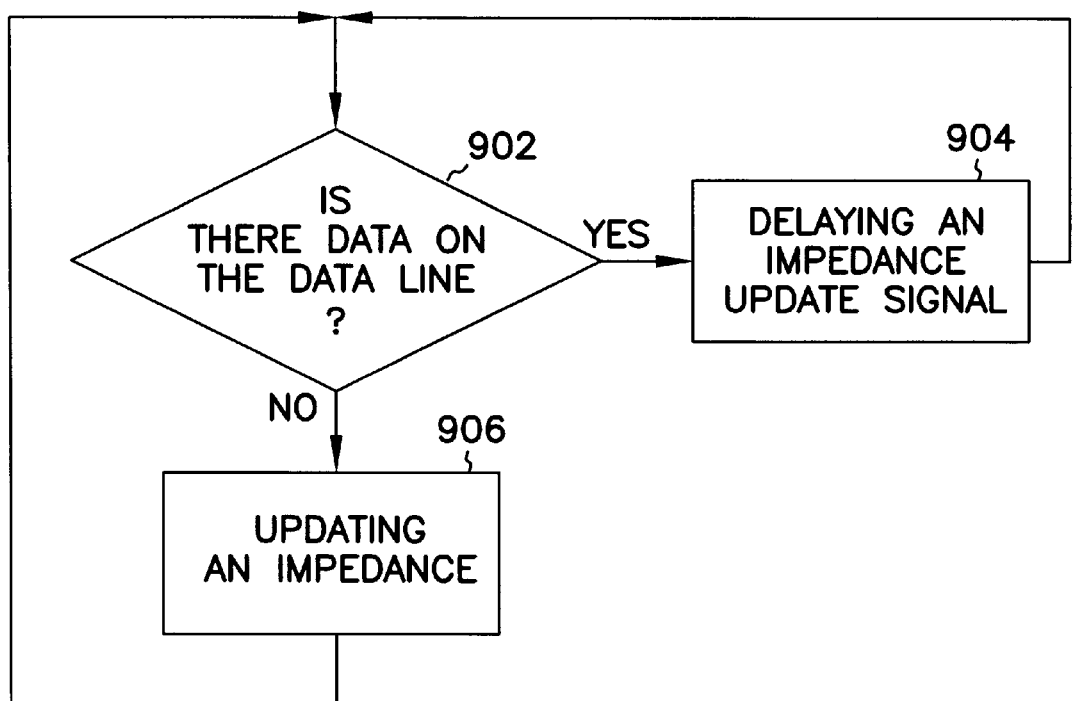
FIG. 9 is a flow chart of method embodiments for impedance matching according to the teachings of the present invention.

FIG. 9 is a flowchart of method embodiments for impedance matching according to the teachings of the present invention. In block 902 of FIG. 9, a data line is sensed. In particular, the data line is sensed (i.e., checked) to determined whether data is being transmitted on such data line. In one embodiment as described above in conjunction with the structure embodiments, the data line is sensed by latching circuitry to determine whether to delay or pass the latched impedance signal. In one embodiment, the latched impedance signal is computed by an onboard controller, as is known in the art. In block 904 as described above in conjunction with the structure embodiments, the latched impedance signal is delayed in a latch when a data line is transmitting a data signal. Further in block 906 as described above in conjunction with the structure embodiments, the impedance is updated. In particular, the impedance of the data output of the circuit is updated when the latched impedance signal is passed and thereby allowing impedance matching circuitry to update the impedance value of the data output to match the impedance of the transmission line.

Advantageously, the impedance value for the data output is only updated when the data line coupled to such data output is not transmitting data (i.e., the data line is quiescent). Moreover, when the data line is active, the impedance matching circuitry applies the impedance value to the data output that was set prior to the data line moving from an inactive to an active state. In other words, the impedance matching circuitry used the prior (i.e., old) impedance value when the data line is in an active state.

Figure 10:
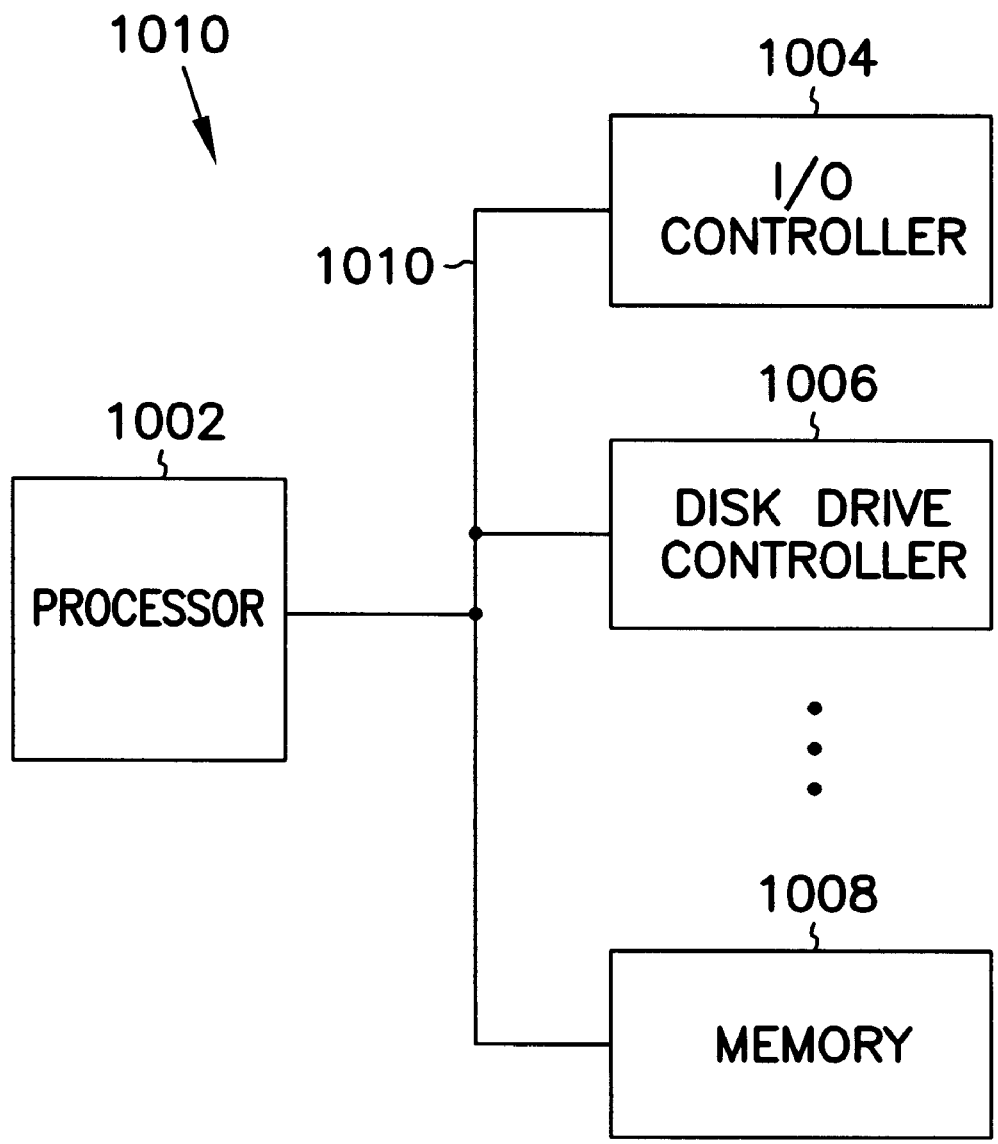
FIG. 10 is a block diagram of a computer system suitable for use in connection with the present invention.

FIG. 10 is a block diagram of electronic system 1000 suitable for use in connection with the present invention. Referring to FIG. 10, a block diagram of a system level embodiment of the present invention is shown. Electronic system 1000 comprises processor 1002, input/output (I/O) controller 1004, disk drive controller 1006 and memory 1008. However, this components of electronic system 1000 are by way of illustration only and not by way of limitation, as other hardware circuitry, which includes embodiments of the present invention, can be included. Transmission line 1010 couples together processor 1002, input/output (I/O) controller 1004, disk drive controller 1006 and memory 1008.

Additionally, processor 1002, input/output (I/O) controller 1004, disk drive controller 1006 and/or memory 1008 include one or more latching circuitry for updating the impedance to match the impedance of transmission line 1010, described above in conjunction with FIG. 1–8. However the invention is not so limited as processor 1002, input/output (I/O) controller 1004, disk drive controller 1006 and/or memory 1008 can include latching circuitry that matches impedance between transmission lines that are internal to their circuitry.

Embodiments of the present invention were applied to either one or two signal lines. However, this is by way of illustration and not by way of limitation as embodiments of the present application can be applied to any number of signal lines. Further, the detailed description illustrates the updating or matching of an impedance. However, the invention is not so limited as embodiments of the present invention can be used to update other circuit variables (e.g., voltage, current or frequency).

CONCLUSION

Thus, improved methods and structures are provided that allow for the updating of output driver impedances for a circuit to match the impedance of the transmission line to which the circuit is coupled. In particular, improved methods and structures are provided which allow for a reliable updating of the output driver impedance without requiring the output driver to be tristated in order to prevent data loss.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for impedance updates comprising:
   sensing a signal line having an impedance;
   changing the impedance of the signal line when the signal line is quiescent; and.
   delaying a change of the impedance when the signal line is transmitting a signal.

2. The method of claim 1, wherein changing the impedance of the signal line includes passing an impedance signal, wherein the impedance signal is equal to a value to which the impedance of the signal line is being changed.

3. The method of claim 1, wherein changing the impedance of the signal line includes matching the impedance of the signal line to an impedance of a transmission line, the transmission line coupled to the signal line.

4. The method of claim 1, wherein changing the impedance of the signal line when the signal line is quiescent includes changing the impedance of the signal line approximately every 512 clock cycles.

5. A method for changing a circuit variable of a signal line comprising:
   delaying an update to the circuit variable of the signal line at a signal output at a holding device when the signal line is transmitting a signal; and updating the circuit variable of the signal line at the signal output when the signal line is quiescent.

6. The method of claim 5, wherein delaying the update to the circuit variable of the signal line includes delaying the update to a voltage of the signal line.

7. A method for output driver impedance updates comprising:
  delaying an update to an impedance of at least one signal line at a signal output at at least one holding device when the at least one signal line is transmitting a signal; and
  updating the impedance of the at least one signal line at the signal output when the at least one signal line is quiescent.

8. The method of claim 7, wherein updating the impedance of the at least one signal line at the signal output includes matching the impedance of the at least one signal line to an impedance of at least one transmission line, wherein the at least one transmission line is coupled to the at least one signal line at the signal output.

9. A method for output driver impedance updates comprising:
  applying a first impedance value for an impedance of a signal line at a signal output, wherein the first impedance value is equal to a value on an impedance line prior to the signal line going active; and
  applying a second impedance value for the impedance of the signal line at the signal output, wherein the second impedance value is equal to a value on the impedance line when the signal line is inactive.

10. A method for output driver impedance updates comprising:
  delaying an update to an impedance of a signal line at a signal output at a holding device when the signal line is transmitting a signal; and
  updating the impedance of the signal line at the signal output when the signal line is quiescent.

11. The method of claim 10, wherein updating the impedance of the signal line at the signal output includes matching the impedance of the signal line to an impedance of a transmission line, wherein the transmission line is coupled to the signal line at the signal output.

12. The method of claim 10, wherein the method further includes coupling the signal line to a memory device.

13. The method of claim 10, wherein delaying the update to the impedance of the signal line at the signal output at the holding device when the signal line is transmitting the signal includes delaying the update to the impedance of the signal line at the signal output at a latch when the signal line is transmitting the signal.

14. A method of forming an integrated circuit, comprising:
  coupling a signal line to an enable input of a holding device; and
  coupling at least one impedance line to a data input of the holding device, the at least one impedance line carrying an impedance signal, wherein an impedance of the signal line at a signal output of the integrated circuit is capable of being updated to a value equal to the impedance signal when the signal line is quiescent.

15. The method of claim 14, wherein the method further includes coupling the signal line to a static random access memory array.

16. The method of claim 14, wherein coupling the signal line to the enable input of the holding device further includes coupling the signal line at the signal output of the memory device to a transmission line having an impedance, wherein the value of the impedance signal is equal to the impedance of the transmission line.

17. A method of matching an impedance, comprising:
  delaying an update to an impedance of a pullup path when the pullup path is transmitting a pullup signal;
  updating the impedance of the pullup path when the pullup path is quiescent;
  delaying an update to an impedance of a pulldown path when the pulldown path is transmitting a pulldown signal; and
  updating the impedance of the pulldown path when the pulldown path is quiescent.

18. A method for impedance updates comprising:
  updating an impedance of a pullup path of a signal line when the pullup path is quiescent; and
  updating an impedance of a pulldown path of the signal line when the pulldown path is quiescent.

19. The method of claim 18, wherein updating the impedance of the pullup path includes matching the impedance of the pullup path to an impedance of a transmission line coupled to a signal output of the pullup path.

20. The method of claim 18, wherein updating the impedance of the pulldown path includes matching the impedance of the pulldown path to an impedance of a transmission line coupled to a signal output of the pulldown path.

21. The method of claim 18, wherein the pullup path and the pulldown path of the data line are coupled to a memory device.

22. A method of updating an impedance comprising:
  computing an impedance of a transmission line;
  matching an impedance of an output of a pullup path to the impedance of the transmission line when the pullup path is quiescent, wherein the pullup path is coupled to the transmission line; and
  matching an impedance of an output of a pulldown path to the impedance of the transmission line when the pulldown path is quiescent, wherein the pulldown path is coupled to the transmission line.

23. The method of claim 22, wherein matching the impedance of the output of the pullup path to the impedance of the transmission line when the pullup path is quiescent includes updating the impedance of the pullup path approximately every 512 clock cycles.

24. The method of claim 22, wherein matching the impedance of the output of the pulldown path to the impedance of the transmission line when the pulldown path is quiescent includes updating the impedance of the pulldown path approximately every 512 clock cycles.

25. An integrated circuit comprising:
  a holding device, wherein at least one impedance update line is coupled to a data input of the latch and wherein the at least one impedance update line transmits an update impedance value; and
  a signal line having an impedance at a signal output of the integrated circuit and coupled to an enable input of the latch, wherein the impedance of the signal line is updated to the update impedance value being transmitted on the at least one impedance update line when the signal line is tristated.

26. The integrated circuit of claim 25, wherein the impedance of the signal line is updated when the holding device is enabled by the signal line.

27. The integrated circuit of claim 25, wherein a transmission line is coupled to the integrated circuit at the data output and wherein the impedance of the data line is updated to match an impedance of the transmission line.

28. The integrated circuit of claim 25, wherein the holding device includes a latch.

29. An integrated circuit comprising:
   a data line having an impedance at a data output of the integrated circuit;
   at least one impedance line coupled to the data line, wherein the at least one impedance line is carrying an impedance signal and wherein the impedance of the data line is updated with a value carried on the impedance signal when the data line is quiescent; and
   an onboard controller coupled to the at least one impedance line, wherein the onboard controller computes the value carried on the impedance signal.

30. The integrated circuit of claim 29, wherein the data output of the integrated circuit is coupled to a transmission line having an impedance.

31. The integrated circuit of claim 29, further including an impedance pin coupled to the onboard controller and externally coupled to resistor, such that the resistor has a resistance equal to approximately 5 times of the impedance of the transmission line and wherein the value carried on the impedance signal is proportional to the resistance of the resistor.

32. A device driver circuit comprising:
   at least one latch having an data output coupled to a data output line;
   an onboard controller coupled to a data input of the at least one latch; and
   a data circuit coupled to an enable input of the at least one latch, wherein an impedance at a data output of the device driver circuit is updated with a value sent from the onboard controller to the at least one latch when the data output line is inactive.

33. The device driver circuit of claim 32, wherein the data output of the device driver circuit is coupled to a transmission line and wherein the value sent from the onboard controller is proportional to an impedance of the transmission line.

34. The device driver circuit of claim 32, wherein the onboard controller computes the value of the impedance of the data output line approximately every 512 clock cycles.

35. A static random access memory (SRAM) comprising:
   a pullup path of a data line, wherein the pullup path has a pullup impedance at a data output of the SRAM;
   a pulldown path of the data line, wherein the pulldown path has a pulldown impedance at the data output of the SRAM;
   a pullup impedance line coupled by a first latch to the pullup path, wherein the pullup impedance line carries an updated impedance value for the pullup path at the data output and wherein the pullup impedance is updated with the updated impedance value for the pullup path when the pullup path is quiescent; and
   a pulldown impedance line coupled by a second latch to the pulldown path, wherein the pulldown impedance line carries an updated impedance value for the pulldown path at the data output and wherein the pulldown impedance is updated with the updated impedance value for the pulldown path when the pulldown path is quiescent.

36. The SRAM of claim 35, wherein the updated impedance value matches an impedance of a transmission line, the transmission line coupled to the pullup path and the pulldown path at the data output of the SRAM.

37. The SRAM of claim 36, further including an onboard controller coupled to the pullup and pulldown impedance lines, wherein the onboard controller computes the updated impedance value for the pullup path and the updated impedance value for the pulldown path.

38. An integrated circuit comprising:
   a holding device having an enable input and a data input;
   at least one data line coupled to the enable input of the holding device; and
   at least one impedance logic line coupled to the data input of the holding device, wherein the at least one impedance logic line transmits an update impedance value and wherein an impedance of the at least one data line at a data output of the integrated circuit is updated with the update impedance value when the at least one data line is quiescent.

39. The integrated circuit of claim 38, wherein the holding device includes a latch.

40. A memory device comprising:
   a data line having an impedance at a data output of the memory device, wherein the data line is coupled to a transmission line at the data output, the transmission line having an impedance; and
   at least one impedance logic line coupled to the data line, where the at least one impedance logic line is capable of carrying an impedance update signal equal to the impedance of the transmission line and wherein the impedance of the data line at the data output is matched to the impedance of the transmission line by the at least one impedance logic line.

41. The memory device of claim 40, wherein the impedance of the data line at the data output is matched to the impedance of the transmission line by the at least one impedance logic line approximately every 512 clock cycles.

42. An integrated circuit for updating an impedance, comprising:
   at least one impedance line carrying an impedance update signal; and
   a latch coupling the at least one impedance line to a data line, the data line having an impedance at a data output of the integrated circuit, wherein the impedance at the data output is updated to a value equal to the impedance update signal when the data line is quiescent.

43. The integrated circuit of claim 42, further including a transistor coupled to the at least one impedance update line at a gate of the transistor, such that the transistor is coupled between a voltage source and the data output.

44. An electronic system comprising:
   a processor; and
   a memory device coupled to the processor through a transmission line, the transmission line having an impedance, wherein the memory device includes:
      a holding device, wherein at least one impedance line is coupled to a data input of the holding device, wherein the at least one impedance line transmits an impedance value approximately equal to the impedance of the transmission line; and
      a data line having an impedance at a data output of the memory device, wherein the data line is coupled to an enable input of the holding device, wherein the impedance at the data output is updated to a value equal to the impedance value when the data line is quiescent.

45. The electronic system of claim 44, wherein the holding device includes a latch.

46. An electronic system comprising:

a processor; and a static random access memory (SRAM) coupled to the processor through a system bus, the system bus having an impedance, wherein the SRAM includes:

a data line having an impedance at a data output of the SRAM; and at least one impedance line coupled to the data line, wherein the impedance line is carrying an impedance update signal and wherein the impedance at the data output is updated with a value carried on the impedance update signal when the data line is quiescent.

47. The electronic system of claim 46, wherein the SRAM further includes an onboard controller coupled to the at least one impedance line, wherein the onboard controller computes the value carried on the impedance update signal.

48. The electronic system of claim 46, further including an impedance pin coupled to the onboard controller and a resistor, such that the resistor has a resistance equal to approximately 5 times of the impedance of the system bus and wherein the value carried on the impedance update signal is proportional to the resistance of the resistor.

49. An electronic system comprising:

a processor; and a static random access memory (SRAM) coupled to the processor through a system bus, the system bus having an impedance, wherein the SRAM includes:

a pullup path of a data line, wherein the pullup path has a pullup impedance at a data output of the SRAM;

a pulldown path of the data line, wherein the pulldown path has a pulldown impedance at the data output of the SRAM;

a pullup impedance line coupled by a first latch to the pullup path, wherein the pullup impedance line carries an updated impedance value for the pullup path at the data output and wherein the pullup impedance is updated with the updated impedance value for the pullup path when the pullup path is quiescent; and a pulldown impedance line coupled by a second latch to the pulldown path, wherein the pulldown impedance line carries an updated impedance value for the pulldown path at the data output and wherein the pulldown impedance is updated with the updated impedance value for the pulldown path when the pulldown path is quiescent.

50. The electronic system of claim 49, wherein the updated impedance value matches the impedance of the system bus.

51. The electronic system of claim 50, further including an onboard controller coupled to the pullup and pulldown impedance lines, wherein the onboard controller computes the updated impedance value for the pullup path and the updated impedance value for the pulldown path.

52. An electronic system comprising:

a processor; and a memory device coupled to the processor through a transmission line, the transmission line having an impedance, wherein the memory device includes:

at least one holding device having an data output coupled to a data output line;

an onboard controller coupled to a data input of the at least one holding device; and a data circuit coupled to an enable input of the at least one holding device, wherein an impedance at a data output of the integrated circuit is updated with a value sent from the onboard controller to the at least one holding device when the data output line is quiescent, wherein the value is approximately equal to the impedance of the transmission line.

53. The electronic system of claim 52, wherein the at least one holding device includes at least one latch.

* * * * *

UNITED STATES PATENT AND TRADEMARK OFFICE
CERTIFICATE OF CORRECTION

PATENT NO. : 6,292,407 B1　　　　　　　　　　　　　　　　　　　　　　　Page 1 of 1
DATED : September 18, 2001
INVENTOR(S) : John D. Porter and Larren Gene Weber It is certified that error appears in the above-identified patent and that said Letters Patent is hereby corrected as shown below:

Column 5,
Line 9, delete "120≥c)," and insert -- 120a-c), --, therefor.

Column 12, claim 1,
Line 48, delete "and." and insert -- and --, therefor.

Column 13, claim 7,
Line 9, delete one instance of "at" after "output".

Column 18, claim 52,
Line 23, delete "an" and insert -- a --, therefor.

Signed and Sealed this

Ninth Day of April, 2002

Attest:

JAMES E. ROGAN
Attesting Officer　　Director of the United States Patent and Trademark Office